United States Patent [19]

Newman, Jr.

[11] Patent Number: 5,550,747
[45] Date of Patent: Aug. 27, 1996

[54] UNBOUNDED MARKER FOR SPECTRUM ANALYSIS

[75] Inventor: James P. Newman, Jr., Santa Rosa, Calif.

[73] Assignee: Hewlett-Packard Company, Palo Alto, Calif.

[21] Appl. No.: 207,003

[22] Filed: Mar. 7, 1994

[51] Int. Cl.$^6$ .................................................. G01R 23/16
[52] U.S. Cl. ...................... 364/485; 364/487; 324/76.22; 324/76.27; 345/121; 345/134; 345/145
[58] Field of Search .................................. 364/484, 485, 364/487; 324/76.19, 76.26, 76.27, 76.22; 395/118, 140–43, 161; 345/121, 134, 157, 160, 173, 208, 145

[56] References Cited

U.S. PATENT DOCUMENTS

| | | | |
|---|---|---|---|
| 4,253,152 | 2/1981 | Holdaway | 364/485 |
| 4,257,104 | 3/1981 | Martin et al. | 364/485 |
| 4,264,958 | 4/1981 | Rowell, Jr. et al. | 364/485 |
| 4,476,579 | 10/1984 | Ito et al. | 455/147 |
| 4,507,740 | 3/1985 | Star et al. | 364/487 |
| 4,586,036 | 4/1986 | Thomason et al. | 345/24 |
| 4,611,164 | 9/1986 | Mitsuyoshi et al. | 324/76.19 |
| 4,660,150 | 4/1987 | Anderson et al. | 364/485 |
| 4,839,582 | 6/1989 | Fukaya et al. | 364/485 |
| 4,859,933 | 8/1989 | Taylor et al. | 364/485 |
| 5,039,937 | 8/1991 | Mandt et al. | 345/134 |
| 5,119,076 | 6/1992 | Wilson | 340/709 |
| 5,177,560 | 1/1993 | Stimple et al. | 356/308 |

Primary Examiner—Emanuel T. Voeltz
Assistant Examiner—Kyle J. Choi

[57] ABSTRACT

An unbounded marker for a swept-tuned analyzer is adjusted by an operator. The frequency of the unbounded marker can be controlled by the operator in three ways, namely, by turning a knob, by pressing UP and DOWN step keys, or by entering a frequency for the unbounded marker using a numeric key pad. The knob continuously adjusts the tune frequency of the analyzer when the unbounded marker reaches the upper or lower boundary of the frequency span. At the high end of the frequency span, the knob continuously re-tunes the start and stop frequencies higher in frequency. At the low end of the frequency span, the knob continuously re-tunes the start and stop frequencies lower in frequency. The unbounded marker remains at the edge of the trace. At the boundaries of the frequency span, the UP and DOWN step keys re-tune the analyzer by a step, the size of which is equal to the frequency span, and the unbounded marker is positioned at the edge of the trace. When the analyzer is fixed tuned to a given frequency, i.e., the frequency span is zero, the step preferably equals 50% of the IF bandwidth. Finally, when the numeric key pad is used to set the unbounded marker frequency and the frequency is outside the current frequency span, the analyzer is re-tuned so that the center of the frequency span is equal to the entered frequency, and the marker is positioned at the entered frequency.

22 Claims, 6 Drawing Sheets

UNBOUNDED MARKER FOR SPECTRUM ANALYSIS

BACKGROUND OF THE INVENTION

This invention relates to electronic instruments for detecting and/or measuring electrical signals and, more particularly, to electronic instruments for detecting and/or measuring the frequency spectrum of electrical signals. Specifically, one embodiment of the invention provides an unbounded marker particularly adaptable for use in an electronic instrument known as a spectrum analyzer for measuring frequency and amplitude of electrical signals. The unbounded marker in accordance with one embodiment of the invention can facilitate a measurement by automatically re-tuning the spectrum analyzer to a new frequency range, thereby improving operator efficiency and enhancing overall measurement throughput.

Signal analysis, simply defined, is the extraction of information from an electrical signal, whether performed in the frequency or time domain. The most common time domain signal analyzer is the oscilloscope. In the frequency domain, the signal analyzer is the network analyzer or spectrum analyzer. These analyzers typically display the raw, unprocessed signal information, that is, voltage, power, period, waveshape, sidebands, and frequency.

By way of example, the spectrum analyzer is widely accepted as a general purpose test instrument capable of performing a broad range of measurements in the frequency domain. Generally, a spectrum analyzer is a scanning receiver that displays power and modulation characteristics of electrical signals over a selected frequency band. Examples of such spectrum analyzers are the HP 8568 and HP 8566 spectrum analyzers, the HP 8590 series spectrum analyzers, and the HP 71000A Modular Spectrum Analyzer available from Hewlett-Packard Company, Palo Alto, Calif.

One technique to perform frequency domain measurements with a spectrum analyzer is known as the swept-tuned technique. The swept-tuned frequency spectrum analyzer can be either a tuned filter or a heterodyned receiver.

Swept-tuned spectrum analyzers are used to measure a variety of characteristics of signals. There are many measurements which can be performed with a spectrum analyzer in response to a transmitted or received signal, where measurement of frequency, power, distortion, gain, and noise characterize a transmitter or receiver system.

Figure 1:
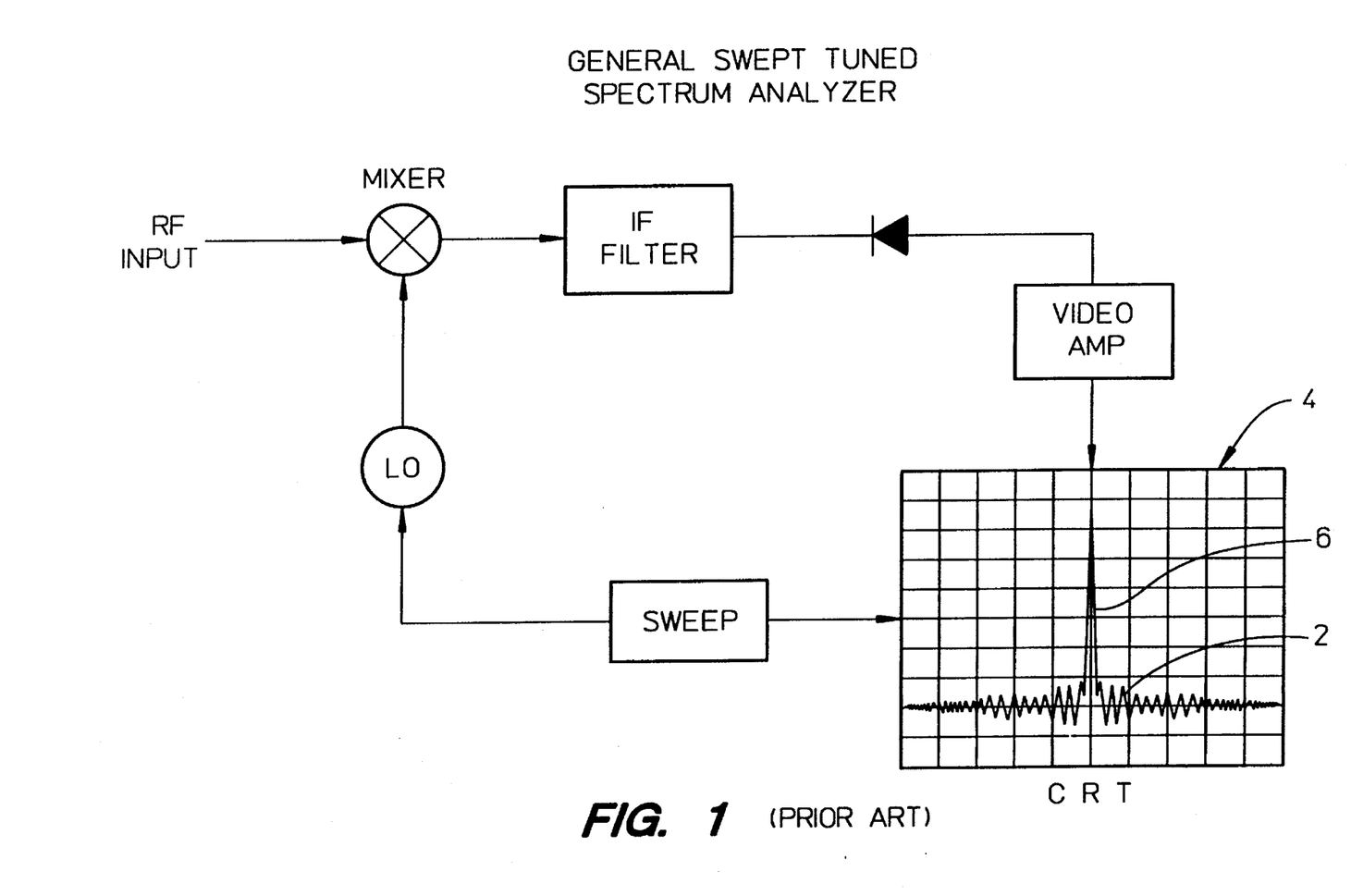
FIG. 1 is a block diagram of a conventional swept-tuned spectrum analyzer.

FIG. 1 shows a generalized superheterodyne swept-tuned spectrum analyzer. An incoming signal mixes with a local oscillator (LO) signal, and when a mixing product equals the intermediate frequency (IF), this signal passes through to a peak detector. The peak detector output is amplified to cause a vertical deflection on a CRT display. The synchronism between the horizontal frequency axis of the CRT display and the tuning of the local oscillator is provided by a sweep generator which both drives the horizontal CRT deflection and tunes the LO.

Considered in more detail, the swept-tuned spectrum analyzer provides real-time, frequency-domain scans (sweeps) over a wide band of the frequency spectrum. The results, called a trace, such as the trace 2 shown in FIG. 1, are displayed on a labeled graticule 4 so that the frequency of individual signals and their corresponding amplitudes can be determined.

Test instruments with graphic displays, such as oscilloscopes, network analyzers, and spectrum analyzers, typically have user controls on a front panel to adjust the parameters of the measurement being performed. The graphic display provides the result of the last measurement that was performed. When the operator adjusts a control setting by means of a knob or button, a new measurement is performed, and the graphic display is updated to reflect the new measured data.

A marker 6 (or multiple markers) can be positioned on the trace for more accurate reading of the frequency and/or amplitude at a given point on the trace. Generally, the marker is the primary method of making measurements using a spectrum analyzer.

On known spectrum analyzers, the marker is adjusted up and down in frequency and is bounded by the start and stop frequencies of the given scan. In order to measure outside the given scan-width, the operator must re-tune the spectrum analyzer and then re-activate the marker before continuing with measurements. This sequence of operator actions, namely, move the marker, re-tune the spectrum analyzer, re-activate the marker, and move the marker, leads to inefficient operation. This is particularly true during the measurement of an unknown spectrum, such as during signal monitoring or electromagnetic emissions measurements.

One solution to this problem is having separate points of control for tuning and the marker. For example, two separate knobs can be provided on the spectrum analyzer. The operator uses one to adjust the tuned frequency and the other to adjust the position of the marker. This solution is better than the traditional marker but still requires the operator to move his hand from one knob to the other in order to perform the measurement.

Additionally, European Patent Application 88103406.0 discloses a "partially scrolling function." This patent application describes a tuning algorithm for speeding up data acquisition and display during tuning of a spectrum analyzer and improving the accuracy of the data acquired. In known spectrum analyzers, data is acquired a single sweep at a time, starting at a fixed start frequency and ending at a fixed stop frequency. The problem that occurs is that when the center frequency of the sweep is changed, there is no data available to take the place of the spectrum being scrolled into view, and, secondly, the sweep typically re-starts at the start of the frequency span and proceeds from lower to higher frequencies. This means that there is a time lag in gathering the new data, because the new spectrum can be swept last, and, also, there is either a flat line or invalid data in the new spectrum. The "partially scrolling function" sweeps the new spectrum first, either sweeping low to high for left scrolling or, for right scrolling, high to low. In this manner there is never invalid data presented or a time lag while a new sweep is performed. However, the "partially scrolling function" is a tuning function. It is not related to use of a marker. It is a method for more quickly and accurately tuning a spectrum analyzer. It does have value in speeding up measurements and assuring that the on-screen trace data is accurate. However, the frequencies and amplitudes of the data scrolled on the screen is raw trace data. It has the problem which all trace data does where the operator cannot easily find the frequency and amplitude of a given signal. Trace data requires visual interpolation between graticule lines along both the frequency and amplitude axes. Hence, a marker is additionally required in connection with the "partially scrolling function." Thus, the "partially scrolling function," for the sake of comparison to a marker, is simply a variation on tuning the spectrum analyzer and has the same drawbacks that tuning in a markerless system does. It would therefore be desirable to provide an unbounded marker that does not require the operator to perform unnecessary actions required during use of a traditional marker or dual front panel controls and which can automatically re-tune the spectrum analyzer to a new frequency range as in the case of the "partially scrolling function." Such an unbounded marker would facilitate the measurement process.

SUMMARY OF THE INVENTION

One embodiment of the invention provides an unbounded marker for spectrum analysis. In accordance with the embodiment of the invention, the marker is not bounded by the start and stop frequencies of the current scan. When the unbounded marker reaches either limit, the unbounded marker automatically re-tunes the test instrument so that another portion of the spectrum is scanned. The operator does not have to perform the unnecessary actions in connection with known test instruments of re-tuning the test instrument and then re-activating the marker. The re-tuning is done automatically as the unbounded marker is moved across the frequency spectrum. This facilitates making adjustments to the control settings of test instruments and allows immediate feedback to the display device independent of sweep time to speed the measurement process. This increases the speed of the measurement process.

In accordance with one embodiment of the invention, the unbounded marker is not limited by the start and stop frequencies of the given frequency span of a spectrum analyzer. When the unbounded marker reaches either limit, the unbounded marker automatically re-tunes the spectrum analyzer so that another portion of the frequency spectrum is scanned. Preferably, the frequency of the unbounded marker can be controlled in three ways, namely, by turning a knob, by pressing step keys, or by entering a frequency for the unbounded marker using a numeric key pad.

Specifically, the knob continuously adjusts the tune frequency of the spectrum analyzer when the unbounded marker reaches the upper or lower boundary of the frequency span. At the high end of the frequency span, the knob continuously re-tunes the start and stop frequencies higher in frequency. At the low end of the frequency span, the knob continuously re-tunes the start and stop frequencies lower in frequency. The unbounded marker remains at the edge of the trace.

Additionally, at the boundaries of the frequency span, UP and DOWN step keys re-tune the spectrum analyzer by a step, the size of which is equal to the frequency span, and the unbounded marker is positioned at the edge of the trace. When the spectrum analyzer is fixed tuned to a given frequency, i.e., the frequency span is zero, the step preferably equals 50% of the IF bandwidth.

Finally, when a numeric key pad is used to set the unbounded marker frequency, the spectrum analyzer is re-tuned so that the center of the frequency span is equal to the entered frequency. The unbounded marker is positioned at the entered frequency.

In known spectrum analyzers, a marker is adjusted up and down in frequency along a displayed trace to produce a display of frequency and amplitude. The marker is bounded by the start and stop frequencies of a predetermined frequency span selected by the operator. In order to measure beyond the given frequency span, the operator must re-tune the spectrum analyzer by entering new start and stop frequencies or a new center frequency and frequency span and then re-activate the marker. The traditional tuning using center frequency is not oriented to measuring signal frequencies and amplitudes. Likewise, the traditional marker is not oriented to tuning the spectrum analyzer. The unbounded marker in accordance with one embodiment of the invention allows seamless measuring and tuning using a single active function. The frequency and amplitude readout provided by the unbounded marker gives the information needed by the operator, but the operator does not need to stop moving the unbounded marker to re-tune the analyzer so off-screen signals can be seen. The marker is unbounded and when it reaches the boundary, begins re-tuning the spectrum analyzer.

The unbounded marker also addresses a different set of problems compared to the "partially scrolling function." The unbounded marker seeks to mitigate an awkward user interface when measuring a series of signals. Some of the signals of interest may be on the screen and some may be below the start frequency and some above the stop frequency. The unbounded marker does not solve the scrolling in of invalid data with a time lag for resweeping. Thus, in slow sweeps, the unbounded marker loses some of its value. However, most measurements are made in wide bandwidths, over relatively narrow frequency spans, so that coupled sweep times are fast. Under these conditions, the "partially scrolling function" loses its value. Data is updated quickly so the operator does not notice any time delay or invalid data.

The unbounded marker in accordance with one embodiment of the invention allows the operator to quickly measure signals both on-screen and beyond the edges of the screen. It is an advantageous melding of marker functionality and tuning functionality.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings:

FIG. 3, comprising FIGS. 3A–3D, is a flow chart of one embodiment of a method in accordance with the invention for providing an unbounded marker that not only measures frequency and amplitude of trace data, but also automatically re-tunes the swept-tuned spectrum analyzer shown in FIG. 2 so that another portion of the frequency spectrum is scanned if the unbounded marker is moved beyond the current frequency range of the trace data.

DETAILED DESCRIPTION OF THE PREFERRED EMBODIMENTS

By way of example, the invention will be described in connection with a superheterodyne swept-tuned spectrum analyzer, because such an analyzer provides wide input frequency coverage while permitting signal processing to be performed at a single intermediate frequency (IF).

Figure 2:
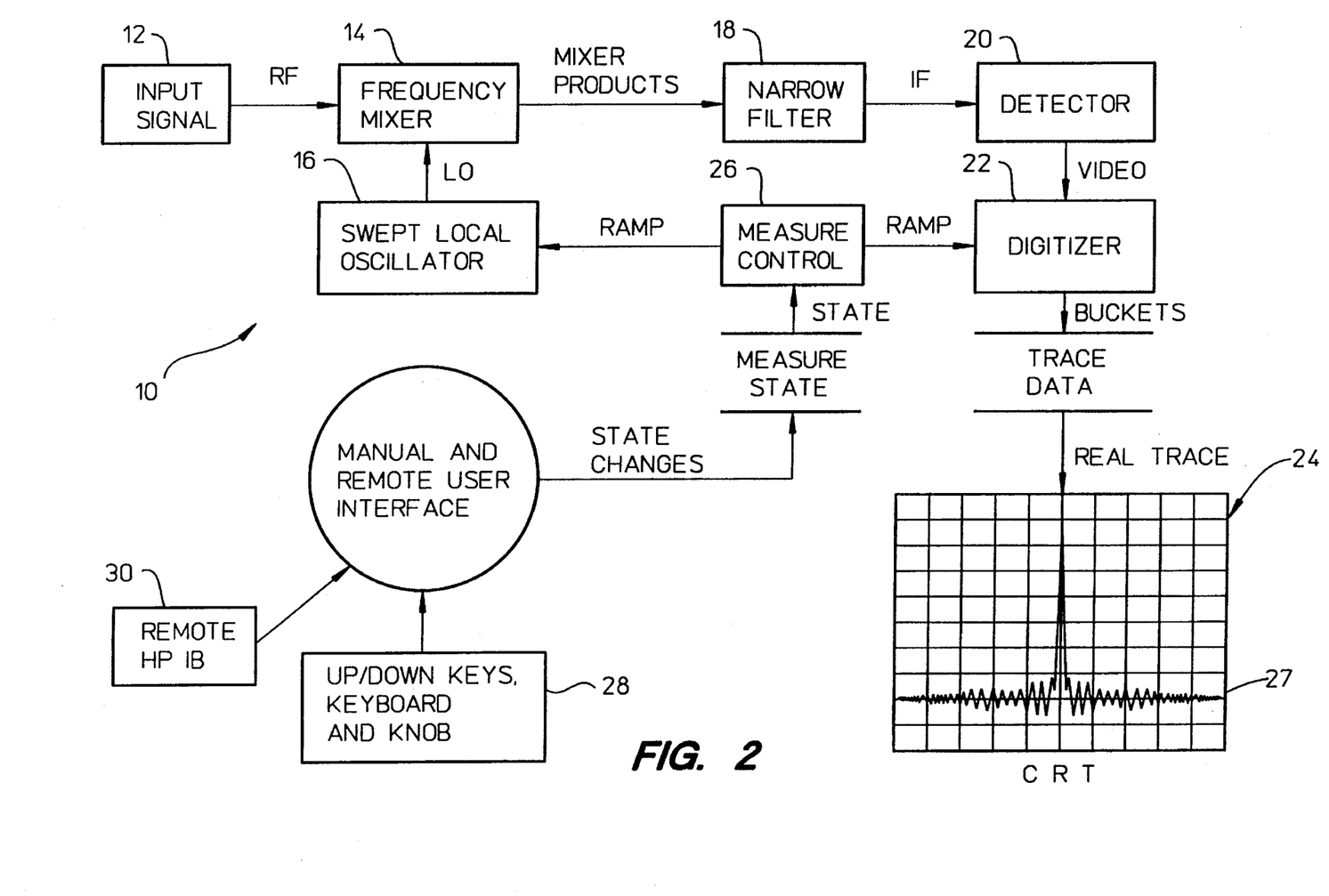
FIG. 2 is a block diagram of a swept-tuned spectrum analyzer in accordance with one embodiment of the invention.

FIG. 2 shows a superheterodyne swept-tuned spectrum analyzer, generally indicated by the numeral 10, in accordance with the invention, which incorporates adjustment of control settings and display of revised trace data in light of the adjustments. An incoming signal appears at an RF input 12. This signal mixes in a frequency mixer 14 with a signal produced by a swept local oscillator (LO) 16.

When a mixing product equals a predetermined IF, this signal passes through an IF filter 18 to a peak detector 20. The peak detector output is fed to a digitizer 22 which samples and stores the detected input signal data. This trace data can be amplified to cause a vertical deflection on a graphic display device or CRT display 24.

The synchronism between the horizontal frequency axis of the display device 24 and the tuning of the local oscillator 16 is provided by a sweep generator incorporated in a measure control circuit 26, which both drives the horizontal deflection of the display device 24 and tunes the local oscillator.

In accordance with the invention, the analyzer 10 displays an unbounded marker 27 which provides a measurement along the trace displayed by the display device 24. The position of the unbounded marker 27 moves while the operator is turning a knob, such as a conventional rotary pulse generator (RPG), or pressing buttons (UP and DOWN step keys) or a numeric key pad, generally indicated by the numeral 28, incorporated into the analyzer 10. The positioning of the unbounded marker 27 can also preferably be remotely adjusted via an interface 30.

The unbounded marker 27 is implemented as part of the finite state machine which governs the actions of the analyzer 10. This finite state machine is incorporated in the embedded program commonly known as firmware. The unbounded marker 27 operates as described below.

The frequency of the unbounded marker can preferably be controlled in one of three ways, namely, by turning the knob, by pressing the UP and DOWN step keys, or by entering the frequency for the unbounded marker using the numeric key pad. Each of these three control techniques will now be described in more detail.

When turning the knob, if the unbounded marker is within the current scan-width of the analyzer 10, the unbounded marker moves continuously across the trace. The frequency and amplitude values of the trace data can be read as the unbounded marker is re-positioned by the operator. When the unbounded marker reaches the upper or lower boundary of the scan, the knob begins to adjust the tune frequency of the analyzer 10. The scan-width of the analyzer 10 is not affected. At the high end of the scan, the knob continuously tunes the start and stop frequencies higher in frequency. At the low end of the scan, the knob continuously tunes the start and stop frequencies lower in frequency. The unbounded marker remains at the edge of the graticule and reads out the frequency and amplitude as usual.

The UP and DOWN step keys are used to step the unbounded marker. When the unbounded marker is between the start and stop frequencies of the scan, the step UP key invokes an algorithm commonly called "next peak right" which endeavors to find the next higher frequency signal in the scan which meets certain criteria. The step DOWN key invokes "next peak left" which endeavors to find the next lower frequency signal in the scan. Both "next peak right" and "next peak left" algorithms are conventional algorithms currently found in spectrum analyzers and therefore do not form a part of this invention. At the boundaries of the scan, the UP and DOWN step keys re-tune the analyzer 10 by a step the size of which is equal to the scan-width of the analyzer. For example, if the analyzer 10 is sweeping from 10 to 20 MHz, the unbounded marker is at the upper end of the frequency scan, and the UP step key is pressed, then the analyzer would re-tune to scan 20 to 30 MHz. The unbounded marker then would be placed at the lower frequency boundary of the new scan. Consequently, in the example above, the unbounded marker would be placed at 20 MHz.

When the analyzer 10 is fixed tuned to a given frequency (i.e., the scan-width is zero) and the unbounded marker is at the boundary of the graticule, the analyzer does not step the tuned frequency by a step equal to the scan-width since the scan-width is zero. Instead, the analyzer 10 preferably steps the tuned frequency by a fixed frequency based on the intermediate frequency (IF) bandwidth. For example, the step can equal 50% of the IF bandwidth. The UP step key re-tunes the analyzer 10 higher in frequency, while the DOWN step key re-tunes the analyzer lower in frequency.

When a numeric key pad is used to set the frequency of the unbounded marker, if the new frequency is within the current scan-width, the unbounded marker is immediately moved to the position on the graticule corresponding to the new frequency. When the new frequency is not within the current scan-width, the analyzer 10 re-tunes with the center of the scan being equal to the newly entered frequency. The scan-width is not changed. The unbounded marker is placed at the center of the scan. For example, with a scan of 10 to 20 MHz and the newly entered frequency 37 MHz, the new scan would be 32 to 42 MHz, and the unbounded marker would be at 37 MHz.

Considered in more detail, one embodiment of the method for spectrum analysis using an unbounded marker to both provide a measurement of frequency and amplitude along a trace and automatically re-tune the analyzer 10 in accordance with the invention is diagrammed by the flow chart shown in FIG. 3. As shown in FIG. 3A, the analyzer 10 determines whether or not the operator has selected the unbounded marker, as indicated by the numeral 30. On the one hand, if the analyzer 10 determines at the step 30 that the operator has not selected the unbounded marker, the analyzer defines the marker to be a conventional, or bounded, marker and moves the marker along the trace to measure the frequency and amplitude along the trace in accordance with traditional marker movement, as indicated by the numeral 32 shown in FIG. 3A.

Figure 3A:
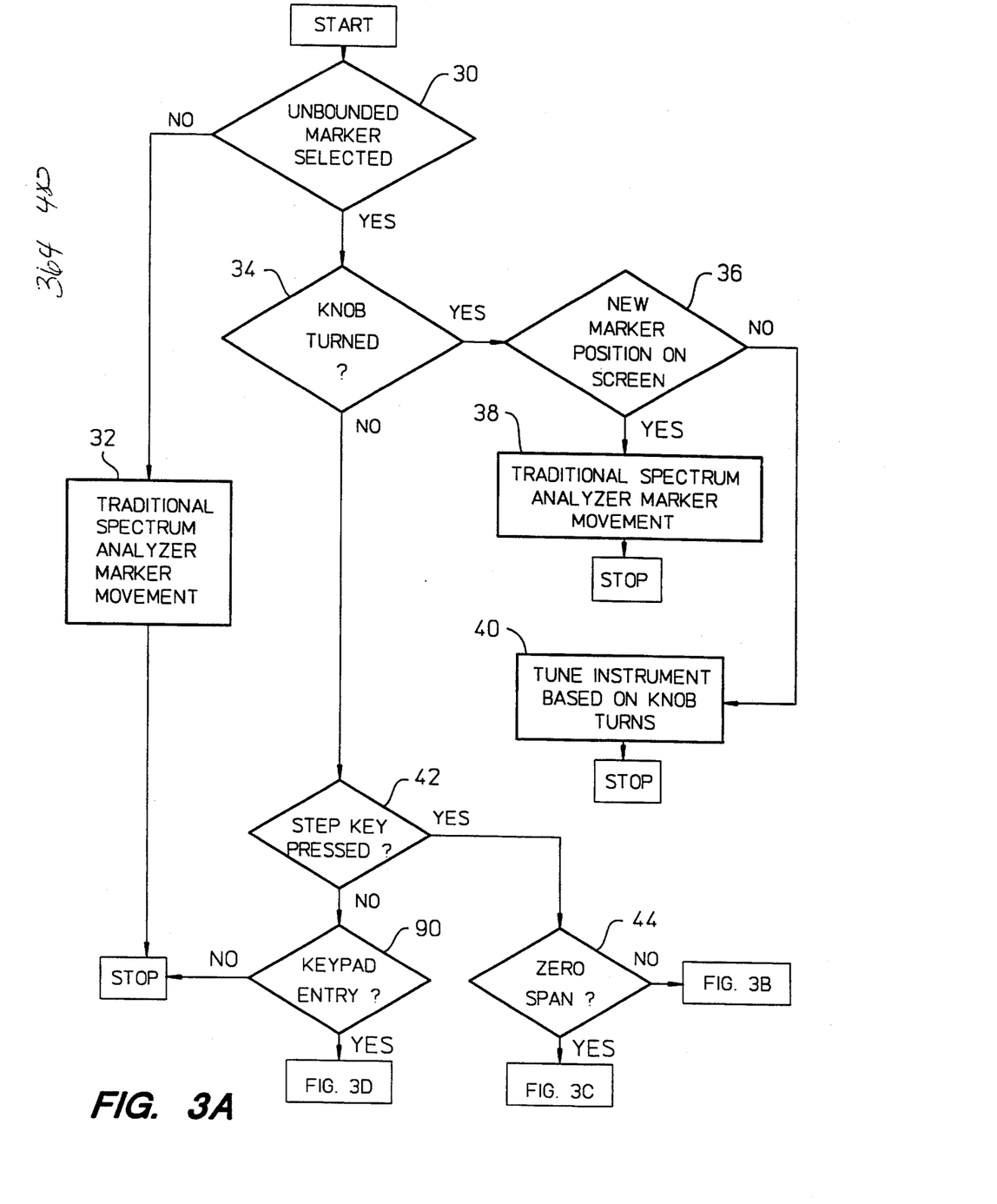

On the other hand, if the analyzer 10 determines at the step 30 that the operator has selected the unbounded marker, the analyzer defines the marker to be an unbounded marker and determines whether or not the knob is being rotated by the operator, as indicated by the numeral 34 shown in FIG. 3A. If the analyzer 10 determines at the step 34 that the operator is rotating the knob, the analyzer monitors whether or not the new marker position is within the current scan-width of the analyzer, as indicated by the numeral 36 shown in FIG. 3A. If, on the one hand, the analyzer 10 determines at the step 36 that the new marker position is within the current scan-width of the analyzer and therefore can move the unbounded marker along the trace displayed on the screen of the display device 24, the analyzer simply moves the unbounded marker along the trace to measure the frequency and amplitude along the trace in accordance with traditional marker movement, as indicated by the numeral 38 shown in FIG. 3A. If, on the other hand, the analyzer 10 determines at the step 36 that the new marker position is beyond the current scan-width of the analyzer, the analyzer is re-tuned based on rotation of the knob by the operator, while the unbounded marker is positioned at the edge of the trace displayed on the screen of the display device 24 as the knob is rotated and the unbounded marker is used to measure the frequency and amplitude at the edge of the trace, as indicated by the numeral 40 shown in FIG. 3A.

If the analyzer 10 determines at the step 34 that the operator is not rotating the knob, the analyzer determines whether or not the operator is pressing the UP or DOWN step key, as indicated by the numeral 42 shown in FIG. 3A. If the analyzer 10 determines at the step 42 that the operator has pressed either the UP step key or the DOWN step key, the analyzer next determines whether or not the analyzer is currently set to zero span, as indicated by the numeral 44 shown in FIG. 3A. If, on the one hand, the analyzer 10 determines at the step 44 that the analyzer is not currently set to zero span, the analyzer next determines whether the operator has pressed the UP step key or the DOWN step key, as indicated by the numeral 46 shown in FIG. 3B. If the analyzer 10 determines at the step 46 that the operator has pressed the UP step key, the analyzer next determines whether or not the unbounded marker is currently positioned at the stop frequency (i.e., the highest frequency of the scan-width), as indicated by the numeral 48 shown in FIG. 3B. If the analyzer 10 determines at the step 48 that the unbounded marker is currently positioned at the stop frequency, the analyzer re-tunes to a new center frequency that is equal to the current center frequency plus the current span (i.e., the new center frequency equals the old center frequency plus the old stop frequency minus the lowest frequency of the old scan-width, or start frequency), as indicated by the numeral 50 shown in FIG. 3B. The analyzer 10 also positions the unbounded marker at the left edge of the trace displayed on the screen of the display device 24 to measure the new start frequency and amplitude, as indicated by the numeral 52 shown in FIG. 3B. If, however, the analyzer 10 determines at the step 48 that the unbounded marker is not currently positioned at the stop frequency, the analyzer sequentially steps the unbounded marker to the "next peak right" in a conventional manner, as indicated by the numeral 54 shown in FIG. 3B. The analyzer 10 then determines whether or not a peak is found to the right, as indicated by the numeral 56 shown in FIG. 3B. If the analyzer 10 determines at the step 56 that a peak is not present, the analyzer moves the unbounded marker to measure the stop frequency and amplitude, as indicated by the numeral 58 shown in FIG. 3B.

Figure 3B:
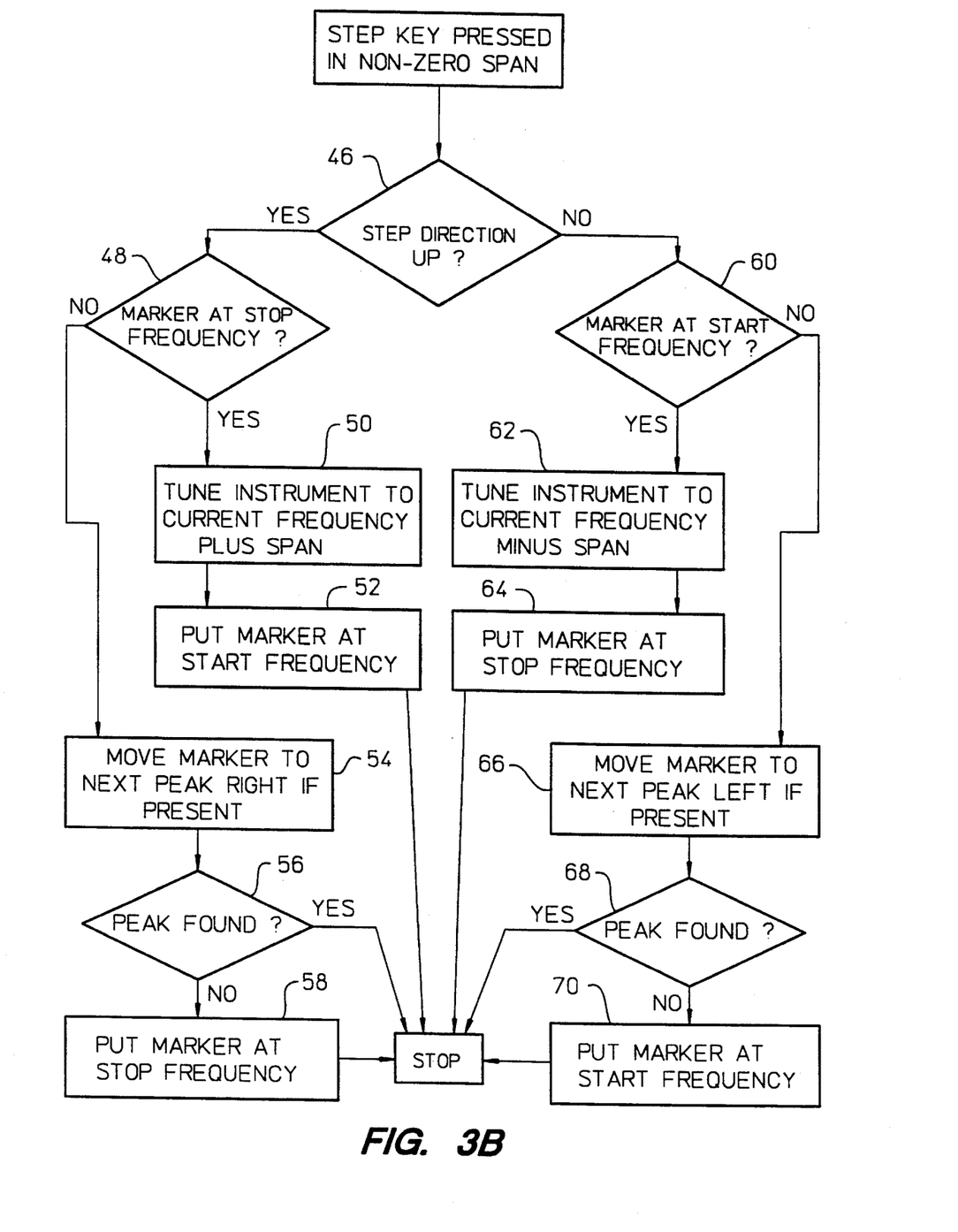

If the analyzer 10 determines at the step 46 that the operator has pressed the DOWN step key, the analyzer next determines whether or not the unbounded marker is currently positioned at the start frequency, as indicated by the numeral 60 shown in FIG. 3B. If the analyzer 10 determines at the step 60 that the unbounded marker is currently positioned at the start frequency, the analyzer re-tunes to a new center frequency that is equal to the current center frequency minus the current span (i.e., the new center frequency equals the old center frequency minus the old stop frequency plus the old start frequency), as indicated by the numeral 62 shown in FIG. 3B. The analyzer 10 also positions the unbounded marker at the right edge of the trace displayed on the screen of the display device 24 to measure the stop frequency and amplitude, as indicated by the numeral 64 shown in FIG. 3B. If, however, the analyzer 10 determines at the step 60 that the unbounded marker is not currently positioned at the start frequency, the analyzer sequentially steps the unbounded marker to the "next peak left" in a conventional manner, as indicated by the numeral 66 shown in FIG. 3B. The analyzer 10 then determines whether or not a peak is found to the left, as indicated by the numeral 68 shown in FIG. 3B. If the analyzer 10 determines at the step 68 that a peak is not present, the analyzer moves the unbounded marker to measure the start frequency and amplitude, as indicated by the numeral 70 shown in FIG. 3B.

Figure 3C:
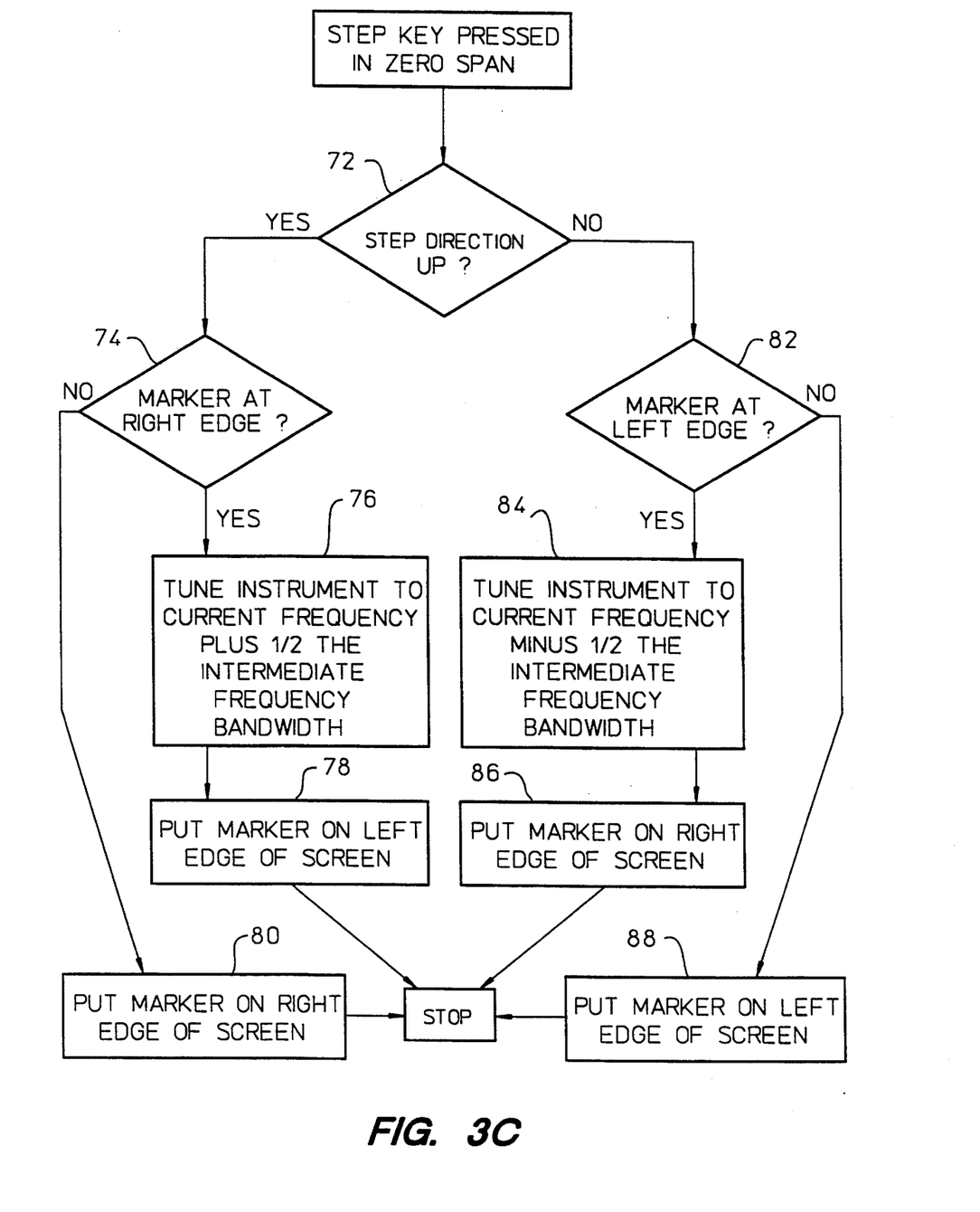
Figure 3D:
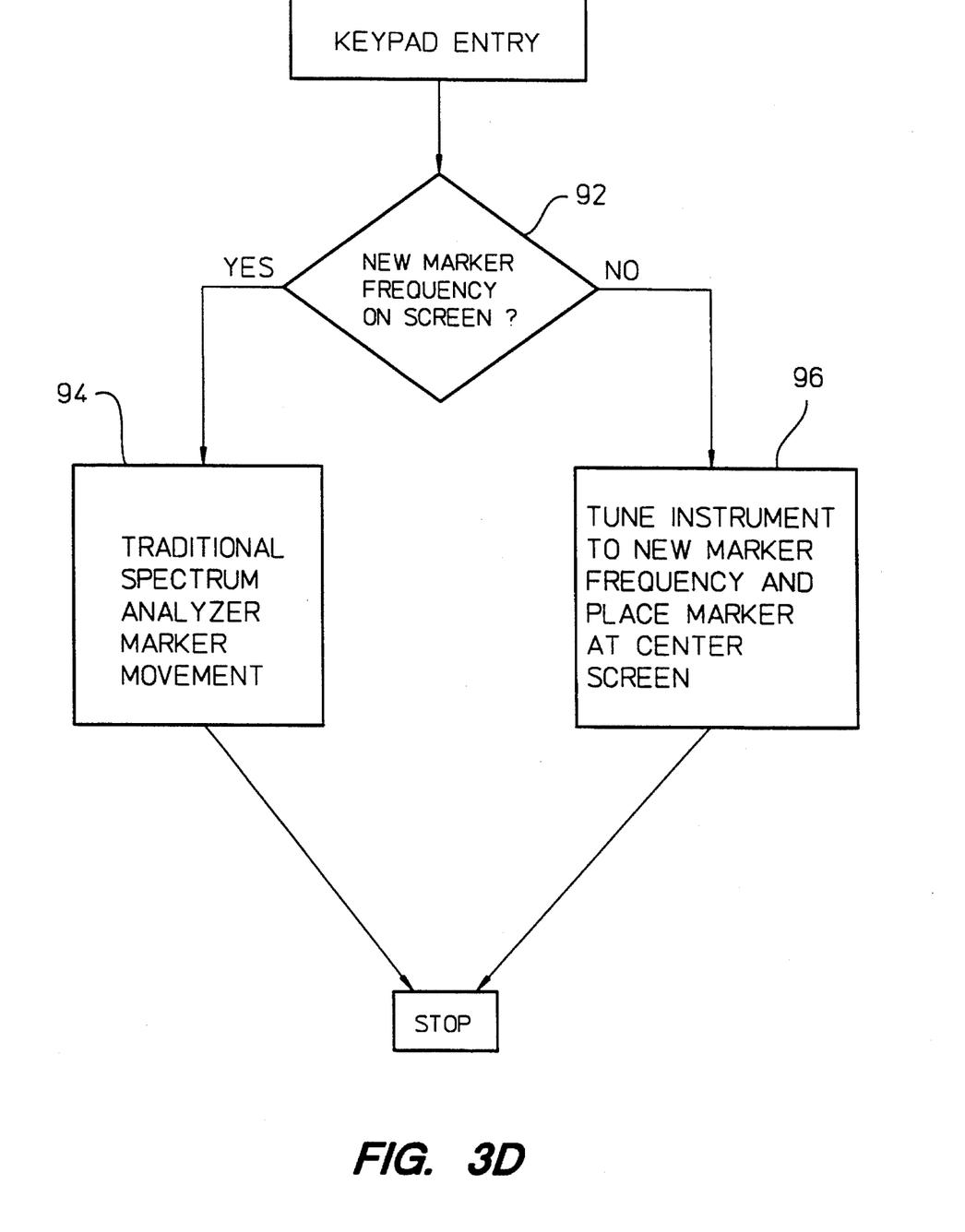

If, on the other hand, the analyzer 10 determines at the step 44 shown in FIG. 3A that the analyzer 10 is currently set to zero span, the analyzer next determines whether the operator has pressed the UP step key or the DOWN step key, as indicated by the numeral 72 shown in FIG. 3C. If the analyzer 10 determines at the step 72 that the operator has pressed the UP step key, the analyzer next determines whether or not the unbounded marker is currently positioned at the right edge of the trace displayed on the display device 24, as indicated by the numeral 74 shown in FIG. 3C. If the analyzer 10 determines at the step 74 that the unbounded marker is currently positioned at the right edge of the trace displayed on the display device 24, the analyzer re-tunes to a new frequency that is equal to the current frequency plus a percentage, such as 50% to 100% of the IF bandwidth, and preferably 50% of the IF bandwidth, as indicated by the numeral 76 shown in FIG. 3C. The analyzer 10 also positions the unbounded marker at the left edge of the trace displayed on the screen of the display device 24 to measure the frequency and amplitude, as indicated by the numeral 78 shown in FIG. 3C. If, however, the analyzer 10 determines at the step 74 that the unbounded marker is not currently positioned at the right edge of the trace displayed on the display device 24, the analyzer moves the unbounded marker to the right edge of the trace displayed on the display device, as indicated by the numeral 80 shown in FIG. 3C.

If the analyzer 10 determines at the step 72 that the operator has pressed the DOWN step key, the analyzer next determines whether or not the unbounded marker is currently positioned at the left edge of the trace displayed on the display device 24, as indicated by the numeral 82 shown in FIG. 3C. If the analyzer 10 determines at the step 82 that the unbounded marker is currently positioned at the left edge of the trace displayed on the display device 24, the analyzer re-tunes to a new frequency that is equal to the current frequency minus a percentage of the IF bandwidth, as indicated by the numeral 84 shown in FIG. 3C. The analyzer 10 also positions the unbounded marker at the right edge of the trace displayed on the screen of the display device 24 to measure the frequency and amplitude, as indicated by the numeral 86 shown in FIG. 3C. If, however, the analyzer 10 determines at the step 82 that the unbounded marker is not currently positioned at the left edge of the trace displayed on the screen of the display device 24, the analyzer moves the unbounded marker to the left edge of the trace displayed on the screen of the display device, as indicated by the numeral 88 shown in FIG. 3C.

Finally, if the analyzer 10 determines at the step 34 that the operator is not rotating the knob and determines at the step 42 that the operator is not pressing the UP or DOWN step key, the analyzer determines whether or not the operator is entering a value corresponding to a new unbounded marker frequency using the numeric key pad, as indicated by the numeral 90 shown in FIG. 3A. If the analyzer 10 determines at the step 90 that the operator has entered a value corresponding to a new unbounded marker frequency using the numeric key pad, the analyzer next determines whether or not the new unbounded marker frequency is within the current frequency span of trace data displayed on the screen of the display device 24, as indicated by the numeral 92 shown in FIG. 3D. If, on the one hand, the analyzer 10 determines at the step 92 that the new unbounded marker frequency is within the current frequency span of trace data displayed on the screen of the display device 24, the unbounded marker is simply moved to the new unbounded marker frequency entered by the operator using the numeric key pad, as indicated by the numeral 94 shown in FIG. 3D. If, on the one hand, the analyzer 10 determines at the step 92 that the new unbounded marker frequency is outside the current frequency span of trace data displayed on the screen of the display device 24, the analyzer is re-tuned to a new center frequency equal to the new unbounded marker frequency entered by the operator using the numeric key pad, and the unbounded marker is moved to the new center frequency, as indicated by the numeral 96 shown in FIG. 3D.

The firmware which controls the HP 8595E spectrum analyzer can be modified to incorporate the unbounded marker. The "C" language source code executed when the operator uses the unbounded marker for spectrum analysis in accordance with the flow chart shown in FIG. 3 is shown in the Appendix.

In operation, the knob continuously adjusts the tune frequency of the analyzer 10 when the unbounded marker reaches the stop (start) frequency. At the high end of the frequency span, the knob continuously re-tunes the start and stop frequencies higher in frequency. At the low end of the frequency span, the knob continuously re-tunes the start and stop frequencies lower in frequency. The unbounded marker remains at the edge of the trace displayed on the screen of the display device 24.

The UP and DOWN step keys operate as follows. When the unbounded marker appears along the trace displayed on the screen of the display device 24, pressing the UP and DOWN step keys results in conventional "next peak right" and "next peak left" functionality, respectively. When at the rightmost (leftmost) peak of the trace displayed on the screen of the display device 24, the next UP (DOWN) key press moves the unbounded marker to the last (first) data point of the trace. The next UP (DOWN) key press then re-tunes the analyzer 10 from center frequency to center frequency plus (minus) frequency span (scan-width). In other words, pressing the UP (DOWN) step key increments (decrements) the center frequency with a step size of the frequency span. The unbounded marker is then positioned at the left (right) edge of the graticule. Subsequent key presses follow the same procedure.

An implication of operation of the UP (DOWN) step keys is that if there are no signals over multiple spans, the UP (DOWN) key will serve to step the center frequency. Two steps of the UP (DOWN) step key would be required. The first would position the unbounded marker on the left (right) edge of the trace displayed on the screen of the display device 24, and the second would position the unbounded marker on the right (left) edge of the trace displayed on the screen of the display device. The third step would re-tune the analyzer 10 to the next span with the unbounded marker at the edge.

In zero span (fixed tune), the UP and DOWN step keys do not step span, since span is zero, but instead step the center frequency as a function of IF bandwidth. In one modification of the analyzer 10, when "SLOW" is selected, the step is 50% of the IF bandwidth. When "FAST" is selected, the step is a full IF bandwidth.

A "FAST" and "SLOW" capability is also desirable in connection with another modification of the analyzer 10, which uses windows. If windows are used, the operator places a large frequency sweep into a top window and uses the top window to navigate, while performing measurements in a narrower bottom window. When windows are used, the unbounded marker functionality provides both "FAST" and "SLOW" tuning so that the operator can move quickly around the span in the top window while still sweeping the bottom window. Preferably, a soft key menu is displayed on the screen of the display device 24 to provide a top level of a test menu on which there is a switch between this "FAST" and "SLOW" unbounded marker tuning capability. When set to "SLOW," the operator re-tunes at the normal speed above and below where the spans are currently tuned. When set to "FAST," the operator is able to move quickly to another frequency range of the top window. This is important, since signals tend to "clump." The operator measures a "clump" in one area of the spectrum by moving the marker slowly, then he can quickly move to another "clump" and return to slow tuning and performing measurements.

Finally, if the numeric key pad is used to enter an unbounded marker frequency which is outside the currently tuned frequency span of the analyzer 10, the analyzer re-tunes the center frequency to the entered frequency and positions the unbounded marker at the center of the trace displayed on the screen of the display device 24.

The unbounded marker in accordance with one embodiment of the invention provides more efficient operation of the analyzer 10. Instead of adjusting two separate parameters of the analyzer 10, namely, tuned frequency and marker frequency, the operator adjusts only the marker frequency. The unbounded marker allows control of both the tuned frequency and the marker frequency through the use of a single operator control, such as a single knob, UP and DOWN step keys, or a numeric key pad. The operator adjusts the unbounded marker frequency, and the analyzer 10 is re-tuned automatically as needed to assure the unbounded marker frequency is within the current frequency scan. This is a major advantage for operators who must measure signals or noise at many frequencies.

It will be understood and appreciated that the embodiments of the present invention described above are susceptible to various additional modifications, changes, and adaptations. For example, although the foregoing description discloses a test instrument which measures RF and microwave signals, the principles of the invention also apply to test instruments which operate in the optical frequency range and measure light waves. Furthermore, while the foregoing description discloses a spectrum analyzer, the principles of the invention also apply generally to test instruments, including oscilloscopes and network analyzers. Not only can adjustments be made with knob turns or button actuations, but by any means for measurement adjustments. All is intended to be comprehended within the meaning and range of equivalents of the appended claims.

What is claimed is:

1. A swept-tuned test instrument, comprising:

an input for receiving an incoming signal;

a swept local oscillator for producing a local oscillator signal over a predetermined range of frequencies;

a frequency mixer connected to the input and to the local oscillator for mixing the incoming signal with the local oscillator signal;

an IF filter connected to the mixer for passing a mixing product when the frequency of the mixing product equals a predetermined IF;

a peak detector connected to the filter to detect the passed signal;

a digitizer connected to the peak detector for sampling and storing the detected signal to form trace data over the predetermined range of frequencies;

a display device connected to the digitizer and responsive to the trace data to cause a vertical deflection on the display device;

a measure control circuit connected to the local oscillator and the display device for driving the horizontal deflection of the display device and tuning the local oscillator; and means connected to the measure control circuit and controlled by an operator for selecting an unbounded marker and moving the unbounded marker along the displayed trace data to measure frequency and amplitude of the trace data, the measure control circuit being responsive to the position of the unbounded marker for automatically re-tuning the local oscillator to adjust the predetermined range of frequencies when the operator causes the unbounded marker to be moved to measure at a frequency beyond the predetermined range of frequencies.

2. The test instrument of claim 1, further comprising an amplifier connected between the digitizer and the display device for amplifying the trace data to cause a vertical deflection on the display device.

3. The test instrument of claim 2 wherein the display device is a CRT display.

4. The test instrument of claim 1 wherein the display device is a CRT display.

5. The test instrument of claim 1 wherein the means for moving the unbounded marker comprises a knob which can be turned by the operator.

6. The test instrument of claim 1 wherein the means for moving the unbounded marker comprises UP and DOWN step keys which can be pressed by the operator.

7. The test instrument of claim 1 wherein the means for moving the unbounded marker comprises a numeric key pad having keys that can be pressed by the operator.

8. The test instrument of claim 1 wherein the means for moving the unbounded marker comprises an interface for remotely moving the unbounded marker.

9. In a swept-tuned instrument having means for providing a marker to measure frequency and amplitude of trace data acquired over a predetermined frequency range and displayed on a display device, the improvement comprising:

means controlled by an operator for selecting an unbounded marker and moving the unbounded marker along the displayed trace data to measure frequency and amplitude of the trace data; and means responsive to the position of the unbounded marker for automatically re-tuning the swept-tuned instrument to adjust the predetermined frequency range when the operator causes the unbounded marker to be moved to measure trace data at a frequency beyond the predetermined frequency range, whereby the speed of measurements is increased.

10. The test instrument of claim 9 wherein the means for moving the unbounded marker comprises a knob which can be turned by the operator.

11. The test instrument of claim 9 wherein the means for moving the unbounded marker comprises UP and DOWN step keys which can be pressed by the operator.

12. The test instrument of claim 9 wherein the means for moving the unbounded marker comprises a numeric key pad having keys that can be pressed by the operator.

13. The test instrument of claim 9 wherein the means for moving the unbounded marker comprises an interface for remotely moving the unbounded marker.

14. A method for providing measurement of frequency and amplitude of an incoming signal detected by a swept-tuned instrument, comprising the steps of:

receiving the incoming signal;

producing a local oscillator signal over a predetermined range of frequencies;

mixing the incoming signal with the local oscillator signal;

passing a mixing product when the frequency of the mixing product equals a predetermined IF;

detecting the passed signal;

digitizing the detected signal to form trace data over the predetermined range of frequencies;

vertically deflecting a display signal responsive to the trace data;

horizontally deflecting the display signal and tuning the local oscillator signal using a measure control circuit; and selecting an unbounded marker and moving the unbounded marker along the displayed trace data to measure frequency and amplitude of the trace data while automatically re-tuning the local oscillator in response to the position of the unbounded marker to adjust the predetermined range of frequencies when an operator causes the unbounded marker to be moved to measure at a frequency beyond the predetermined range of frequencies.

15. The method of claim 14 wherein the step of moving the unbounded marker comprises using a knob connected to the measure control circuit, which can be turned by an operator to move the unbounded marker along the displayed trace data.

16. The method of claim 15 wherein the knob continuously adjusts the tune frequency of the local oscillator signal when the unbounded marker reaches an upper or a lower boundary of the frequency span and wherein, at the high end of the frequency span, the knob continuously re-tunes start and stop frequencies of the local oscillator higher in frequency, and, alternatively, at the low end of the frequency span, the knob continuously re-tunes the start and stop frequencies lower in frequency, the unbounded marker remaining at an edge of the displayed trace data.

17. The method of claim 14 wherein the step of moving the unbounded marker comprises using UP and DOWN step keys connected to the measure control circuit, which can be pressed by an operator to move the unbounded marker.

18. The method of claim 17 wherein, when the unbounded marker is at the boundaries of a frequency span of the local oscillator, the UP and DOWN step keys re-tune the local oscillator frequency by a step, the size of which is equal to the frequency span, and wherein the unbounded marker is positioned at an edge of the displayed trace data.

19. The method of claim 17 wherein the swept-tuned instrument is fixed tuned to a given frequency to provide a frequency span of zero and the local oscillator frequency is re-tuned by a frequency increment equal to 50% to 100% of the IF bandwidth of the swept-tuned instrument when the UP and DOWN step keys are pressed.

20. The method of claim 14 wherein the step of moving the unbounded marker comprises using a numeric key pad having keys connected to the measure control circuit, that can be pressed by an operator to move the unbounded marker.

21. The method of claim 20 wherein, when the numeric key pad is used to enter a frequency and the entered frequency is not within the frequency span of the swept-tuned instrument, the local oscillator frequency is re-tuned so that the center of a frequency span is equal to the entered frequency and the unbounded marker is positioned at the entered frequency.

22. The method of claim 14 wherein the step of moving the unbounded marker comprises using an interface for remotely moving the unbounded marker.

* * * * *